United States Patent [19]

Kawashima

[11] Patent Number: 5,218,415
[45] Date of Patent: Jun. 8, 1993

[54] DEVICE FOR OPTICALLY DETECTING INCLINATION OF A SURFACE

[75] Inventor: Haruna Kawashima, Kawasaki, Japan

[73] Assignee: Canon Kabushiki Kaisha, Tokyo, Japan

[21] Appl. No.: 830,525

[22] Filed: Feb. 4, 1992

Related U.S. Application Data

[63] Continuation of Ser. No. 632,664, Dec. 27, 1990, abandoned, which is a continuation of Ser. No. 359,121, May 31, 1989, abandoned.

[30] Foreign Application Priority Data

May 31, 1988 [JP] Japan .................. 63-134123

[51] Int. Cl.⁵ .................. G01C 1/00; G01C 21/06
[52] U.S. Cl. .................. 356/152; 250/237 R; 250/561; 356/150; 356/375
[58] Field of Search .................. 356/152, 150, 375; 250/237 R, 561

[56] References Cited

U.S. PATENT DOCUMENTS

| | | | |
|---|---|---|---|
| 4,127,777 | 11/1978 | Binder | 250/548 |
| 4,558,949 | 12/1985 | Uehara et al. | 356/152 |
| 4,589,769 | 5/1986 | Matsuki | 355/71 |
| 4,589,773 | 5/1986 | Ido et al. | 356/1 X |
| 4,641,035 | 2/1987 | Suzuki et al. | 250/548 |
| 4,645,924 | 2/1987 | Suzuki et al. | 250/236 |
| 4,650,983 | 3/1987 | Suwa | 250/205 X |
| 4,698,513 | 10/1987 | Tojo et al. | 356/1 X |
| 4,704,020 | 11/1987 | Murakami et al. | 356/152 X |
| 4,823,014 | 4/1989 | Miyawaki | 250/548 |
| 4,902,900 | 2/1990 | Kamiya et al. | 250/548 |
| 4,952,815 | 8/1990 | Nishi | 250/548 |

FOREIGN PATENT DOCUMENTS 62-140418 6/1987 Japan .

Primary Examiner—Stephen C. Buczinski
Attorney, Agent, or Firm—Fitzpatrick, Cella, Harper & Scinto

[57] ABSTRACT

A device for detecting the inclination of a surface to be examined is disclosed. The device includes an optical arrangement for directing a radiation beam to the surface to be examined, an arrangement for receiving a reflected beam from the surface to be examined and for outputting a signal corresponding to the inclination of the surface to be examined, and a device for changing the size of the beam on the surface to be examined or the size of the beam at a position which is substantially optically conjugate with the surface to be examined.

15 Claims, 12 Drawing Sheets

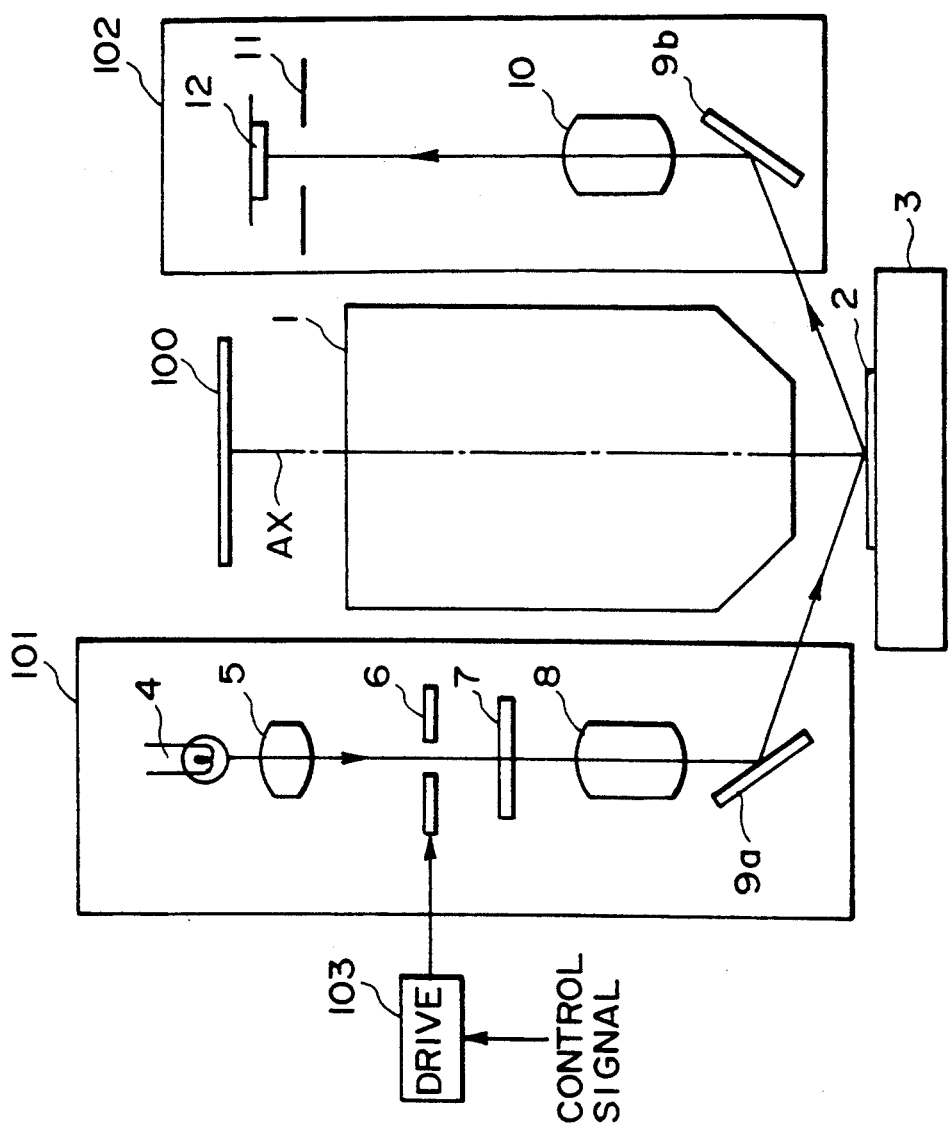
F I G. 1

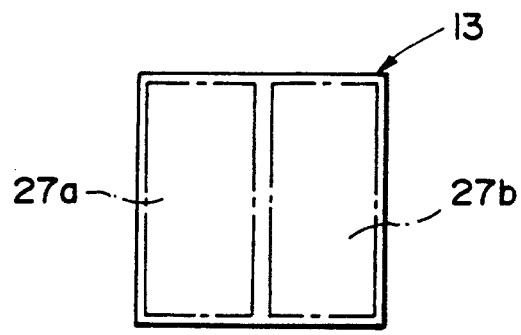
F I G. 10A
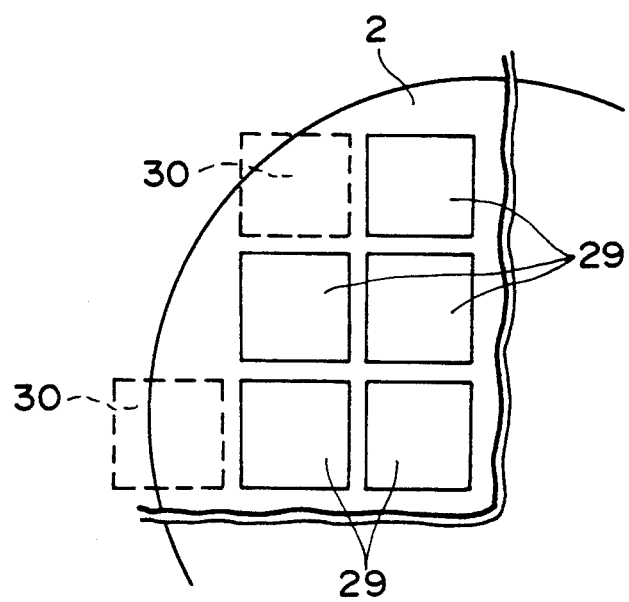
F I G. 10B
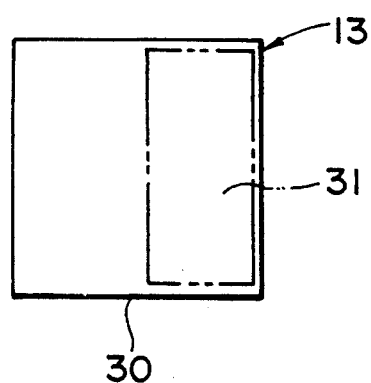
F I G. 10C

1

DEVICE FOR OPTICALLY DETECTING INCLINATION OF A SURFACE

This application is a continuation of prior application, Ser. No. 07/632,664 filed Dec. 27, 1990, which application is a continuation of prior application, Ser. No. 07/359,121 filed May 31, 1989, both now abandoned.

FIELD OF THE INVENTION AND RELATED ART

This invention relates to an optical inclination detecting device and, more particularly, to a detecting device suitably usable in a projection exposure apparatus for the manufacture of semiconductor microcircuit devices, for detecting the inclination of a surface of a wafer with respect to an image surface of a projection optical system.

An example of such a device is disclosed in U.S. Pat. No. 4,558,949, wherein a region of a wafer surface to be exposed is irradiated with light, and the light reflected from this region is received by a photoelectric converting element, whereby an electric signal corresponding to inclination of the wafer surface with respect to an image surface of a projection lens is obtained from this converting element.

In such a detecting device, however, depending on the size of the region to be exposed, it is difficult to detect the inclination with sufficient precision. Thus, the device cannot be used for the detection of inclination of a wafer surface, for many ranges in size of the subject of the measurement (the region to be exposed).

SUMMARY OF THE INVENTION

It is, accordingly, an object of the present invention to provide an optical inclination detecting device having the ability to detect the inclination of a surface to be examined, consistently at a desired precision.

In one form of the present invention, to achieve this object, the detecting device includes a means for directing a radiation beam to a surface to be examined, a light receiving means for receiving any portion of the beam reflected by the surface to be examined and for producing a signal corresponding to the inclination of the surface to be examined, and a means which is operable to change the size of the beam on the surface to be examined or the size of the beam at a position substantially optically conjugate with the surface to be examined.

Use of the changing means is effective to change the beam irradiation range on the surface to be examined, or it allows the selection of a reflected beam to be used for the signal formation. As an example, for the detection of the inclination of a wafer surface, it is possible to change the cross-sectional size of the beam in accordance with the size of the zone on the wafer to be exposed (the subject of the measurement), in order to assure that a produced signal contains inclination information related to the entire region to be exposed. If this is achieved, the inclination of the wafer surface can be detected, consistently at a good precision.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of an inclination detecting device according to a first embodiment of the present invention.

FIGS. 10A–10C are representations, for explaining an example of the manner of detecting the inclination of different shot area surfaces of a wafer, in sequence, by use of the inclination detecting device of the present invention.

DESCRIPTION OF THE PREFERRED EMBODIMENTS

Figure 2A:
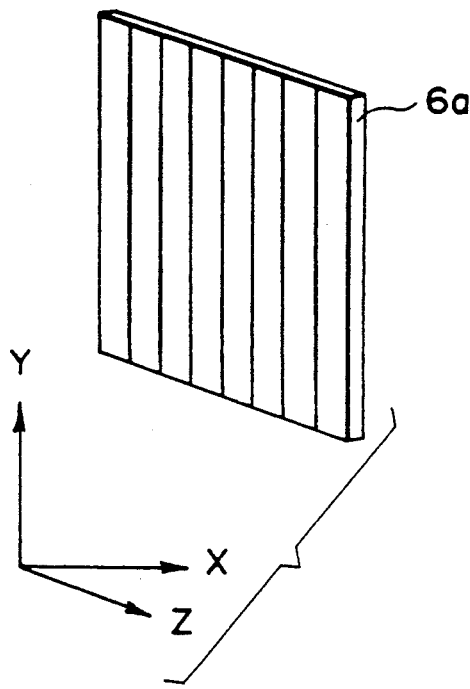
FIGS. 2A, 2B, and 2C are explanatory views showing the structure of a variable-aperture stop using a liquid crystal shutter.

FIG. 1 is a schematic view of an inclination detecting device according to a first embodiment of the present invention, in which the device is incorporated into a semiconductor microcircuit device manufacturing reduction projection type exposure apparatus, for the detection of the inclination of a wafer surface. In FIG. 1, denoted by reference numeral 1 is a reduction projection lens system which is adapted to project, in a reduced scale, a circuit pattern formed on a reticle 100 surface upon a predetermined region (to be exposed) of a wafer 2 surface which is coated with a resist material.

Denoted by reference numeral 3 is a movable stage on which the wafer 2 is placed. The stage 3, carrying the wafer 2 thereon, is movable in a direction parallel to an optical axis AX of the projection lens system 2, and in a plane perpendicular to the optical axis AX. Also, the stage 3 is provided with an adjusting mechanism (not shown) by which the surface of the wafer 2 can be inclined relative to a plane perpendicular to the optical axis AX.

Denoted generally by reference numerals 101 and 102 are a light projecting system and a light receiving system of the inclination detecting device, respectively.

In this embodiment, light emanating from a white light source 4 is concentrated by a condensing lens 5, and a stop 6 having a variable-diameter aperture is illuminated. The stop 6 comprises a liquid crystal shutter, for example, and is structured so that the shape of its aperture can be changed as desired. The light passing through the aperture of the stop 6 enters a filter 7 so that such a wavelength component thereof that sensitizes the resist material on the wafer 2 is intercepted. After this, the light impinges on an illuminating lens 8. Then, by way of this illuminating lens 8 and a mirror 9a, the light is directed to the surface of the wafer 2. Here, the lens 8 and the mirror 9a are disposed so that the edge of the aperture of the stop 6 and the point of incidence of light on the wafer 2 surface are placed substantially in an optically conjugate relationship. By this, an image of the edge of the aperture of the stop 6 is formed on the wafer 2 surface, or in the neighborhood thereof. The stop 6 is adapted to be actuated by a driving means 103 so that the size (shape) of the aperture is changed in accordance with the size of the zone (shot area) of the wafer 2 surface on which the reticle pattern is to be projected. This makes it possible to change the diameter of the light passing through the aperture, whereby substantially the entire surface of the zone of the wafer 2, on which the reticle pattern is to be projected, can be irradiated with the light, and whereby, no light is projected to a portion other than (or surrounding) that zone.

The light reflected by the wafer 2 surface is reflected by a mirror 9b and is directed to another stop 11 by a detecting lens 10. Then, the light passing through an aperture of the stop 11 impinges on a photoelectric converting element 12 (for two-dimensional position detection) such as a position sensing diode, for example, which is disposed in the neighborhood of the position of a pupil of the detecting lens 10.

In this example, the stop 11 is disposed at a position which is spaced from a rear principal point of the detecting lens 10 along the optical axis of the light receiving system 102 by a focal length of the detecting lens 10. The stop 11 functions as a frequency cut filter and is effective to intercept any scattered light from the wafer 2, which occurs at an edge of a pattern (circuit pattern or otherwise) formed on the wafer 2 as a result of a preceding process. Consequently, only a zeroth-order component of the reflected light, of the light reflected by the wafer 2, can be incident upon the photoelectric converting element 12, whereby high-precision inclination detection with less noise is attainable.

Figure 2B:
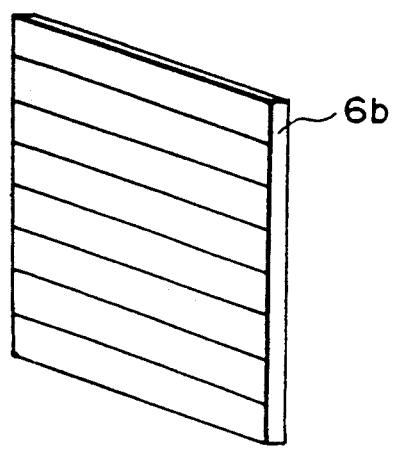
Figure 2C:
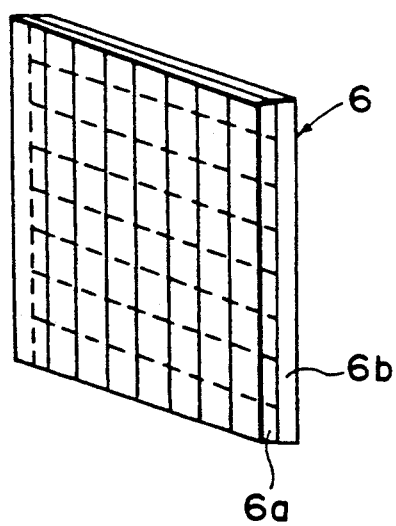

FIG. 2A through 2C illustrate illustrates the structure of an example of a variable-aperture stop 6 usable in this embodiment. In the illustrated example, the aperture of the stop 6 is made variable by using a liquid crystal shutter means.

More specifically, the stop 6 comprises a liquid crystal plate 6a such as shown in FIG. 2A and another liquid crystal plate 6b such as that shown in FIG. 2B, wherein these liquid crystal plates 6a and 6b are combined into a single structure such as that shown in FIG. 2(C). In FIG. 2A, the liquid crystal plate 6a includes stripe-like liquid crystal shutter members, each extending in a Y-direction. Each of these liquid crystal shutter members is adapted to be changed, between a non-transparent or darkened state, and a transparent state, independently of the other shutter members, in response to reception or non-reception of an electric voltage. In FIG. 2B, the liquid crystal plate 6b includes an array of stripe-like liquid crystal shutter members, each extending in a Z direction. Each of these liquid crystal shutter members is adapted to be changed between a non-transparent, or darkened state, and a transparent state, independently of the other shutter members, in response to reception or non-reception of an electric voltage. As shown in FIG. 2C these liquid crystal plates 6a and 6b are coupled to each other in such a manner that the arrays of the liquid crystal shutter members extend orthogonally to each other, whereby a stop 6 is provided. Here, the X axis corresponds to a direction which is parallel to the optical axis of the light projecting system 101.

Usually, a region to which a reticle pattern is to be transferred has a rectangular shape. In consideration thereof, in this embodiment, the aperture of the stop 6, which is variable, has a rectangular shape.

Each stripe-like liquid crystal shutter member has a sufficiently narrow width to ensure that, under the influence of the driving means 103, the aperture shape can be changed so that, for a variable size of the zone of the wafer 2 surface to which the reticle pattern is to be transferred, substantially the entirety of such a zone can be irradiated with a light beam substantially the same size as the zone.

Figure 3A:
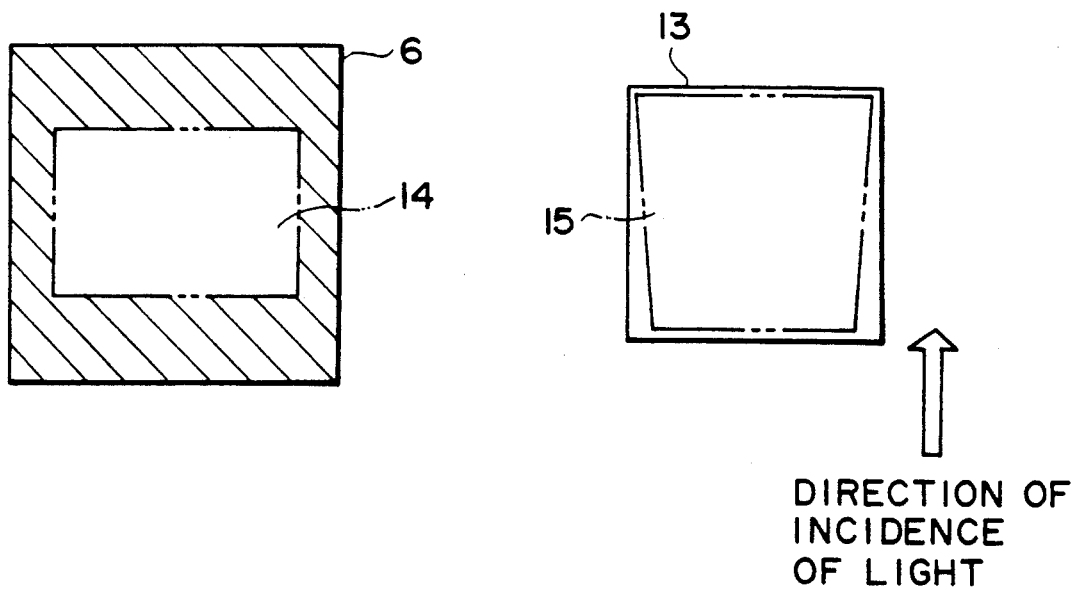
FIGS. 3A and 3B are explanatory views, respectively, for illustrating the relationship between a region to be exposed and an illumination region, wherein the aperture diameter of the variable-aperture stop is changed.
Figure 3B:
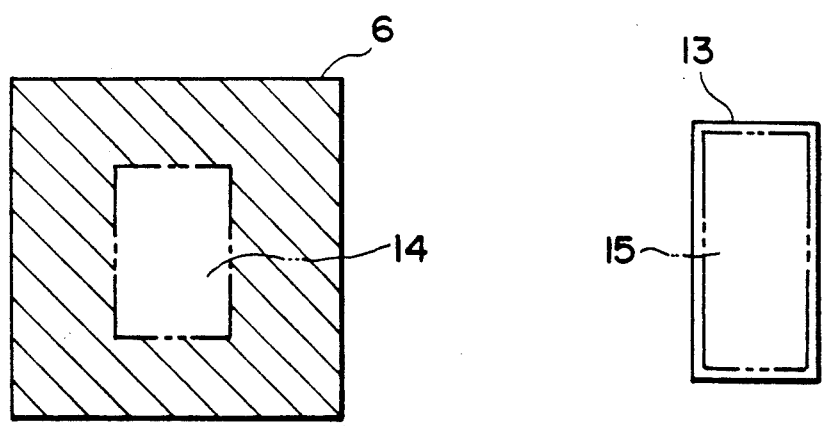

FIGS. 3A and 3B illustrate the relationship between a zone to be exposed (shot area) and an illumination region, defined by varying the aperture of a stop 6 such as that shown in part (C) of FIG. 2. In accordance with the size of the zone (shot area) 13 to which a reticle pattern is to be transferred, the portion of the stop 6 as depicted by hatching is rendered into a non-transparent state, such that only a blank region 14 encircled by a chain line shows transmissibility to light. Here, as shown in the right-hand half of FIG. 3A, to such a zone 13 of the wafer 2 to which a reticle pattern is to be transferred, the light directed toward the wafer 2 surface irradiates a region 15 of a trapezoidal shape, as encircled by a chain line. Thus, substantially the entire surface of the zone 13 to which the reticle pattern is to be transferred, can be irradiated with the light.

In this example, as described, to a rectangular zone 13 of the wafer 2 to which a reticle pattern is to be transferred, such an illumination region as having a trapezoidal shape different from the shape of the zone 13 is defined. This is because the wafer surface does not perpendicularly intersect the optical axis of the light projecting system 101, and a plane containing the edge of the aperture of the stop 6 is not completely placed in an imaging relationship with the zone to which the reticle pattern is to be transferred.

Since the light from the light projecting system 101 is incident on an inclined zone (to which a reticle pattern is to be transferred) within a plane normal to the wafer 2 surface and to the optical axis of the light projecting system 101 (i.e. the sheet of the drawing), the rectangular aperture of the variable-aperture stop 6 is projected on the wafer surface with elongation. Preferably, to avoid such a problem, an adjustment may be made to the ratio, in size, of the lateral and longitudinal sides of the rectangular aperture of the stop 6 to assure that the illumination region substantially agrees to the zone 15 to which a reticle pattern is to be transferred.

Figure 4A:
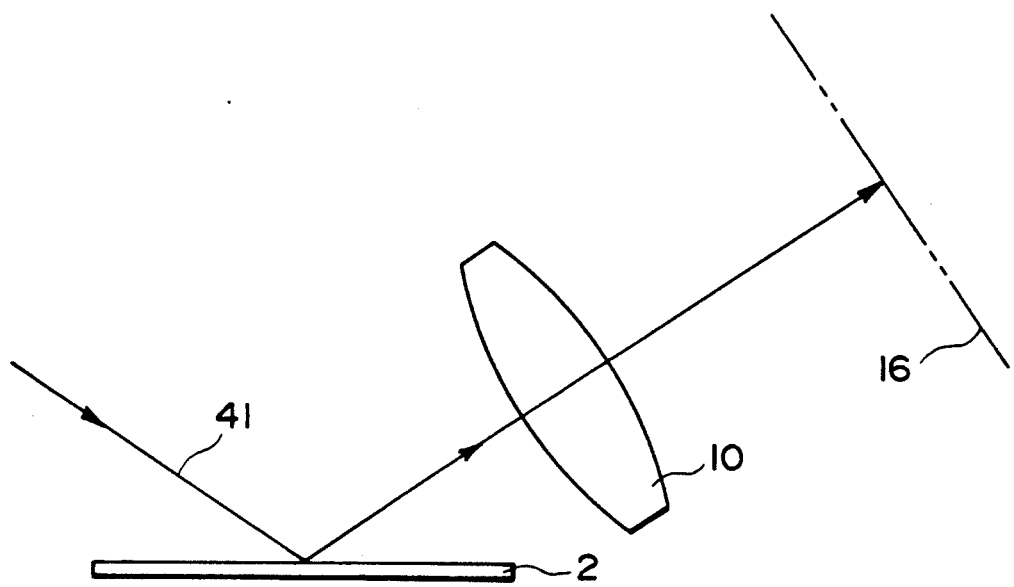
FIGS. 4A and 4B are explanatory views, respectively, illustrating the principle of the detection of the inclination of a wafer surface.
Figure 4B:
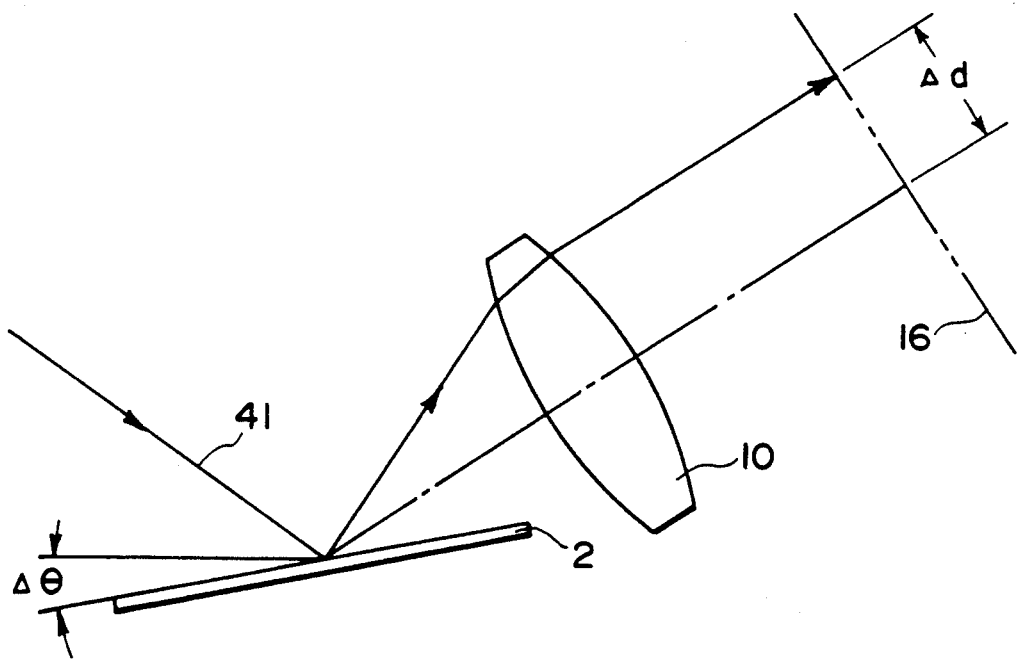

FIGS. 4A and 4B illustrate the principle of a detection, for detecting the inclination of the wafer 2 surface on the basis of the position of the incidence of a reflected light impinging on a pupil plane of the detecting lens 10 shown in FIG. 1.

If the surface of the wafer 2 is parallel to the image surface of the projection lens and thus, the wafer 2 is not inclined, as shown in FIG. 4A, light 41 incident on the wafer 2 surface and reflected thereby goes through the detecting lens 10 and is incident at the center of the pupil plane 16 of the detecting lens 10. In the state of FIG. 4A, prior to the inclination detection, the vertical position of the wafer 2 surface in the direction of the optical axis of the projection lens system 1 (FIG. 1) is adjusted with respect to the image surface of the projection lens system 1 by using an autofocusing system such as that disclosed in Japanese Laid-Open Patent Application, Laid-Open No. Sho 62-140418, for example.

If, on the other hand, the wafer 2 surface is not parallel to the image surface of the projection lens and thus, the wafer 2 is inclined by an angle $\Delta\theta$ as compared with the state shown in FIG. 4A, such as illustrated in the FIG. 4B case, the light incident on the wafer 2 surface and reflected thereby goes through the detecting lens 10 and then, is incident at a position on the pupil plane 16 of the detecting lens 10, spaced by a distance $\Delta d$ from the center of the pupil plane. Here, $\Delta d \simeq f\Delta\theta$, wherein $f$ is the focal length of the detecting lens 10.

Namely, the inclination $\Delta\theta$ of the wafer 2 surface with respect to the image surface corresponds to the positional deviation $\Delta d$ of the light incident on the pupil plane.

In this embodiment, a photoelectric converting element 12 having a two-dimensional position detecting function (such as a two-dimensional position sensor, a two-dimensional CCD sensor, or a quadrant sensor, for example) is disposed adjacent to the pupil position of the detecting lens 10 (pupil plane of the light receiving system 102), and any deviation of the position of incidence of the wafer reflected light upon the photoelectric converting element, with respect to a reference position, is detected. On the basis of such deviation, the amount of the inclination, if any, of the surface of the wafer 2 is detected.

In this embodiment, as described, any inclination of the wafer 2 surface with respect to the image surface of the projection lens 1 is detected, and adjustment is made to correct or compensate for the inclination to render the image surface and the wafer 2 surface parallel to each other. By this, a correct and an accurate imaging relationship can be established between the reticle pattern and the region of the wafer 2 to be exposed. Therefore, with the present invention, it is possible to provide a projection exposure apparatus having the ability of correction and for accurate pattern transfer.

Figure 5A:
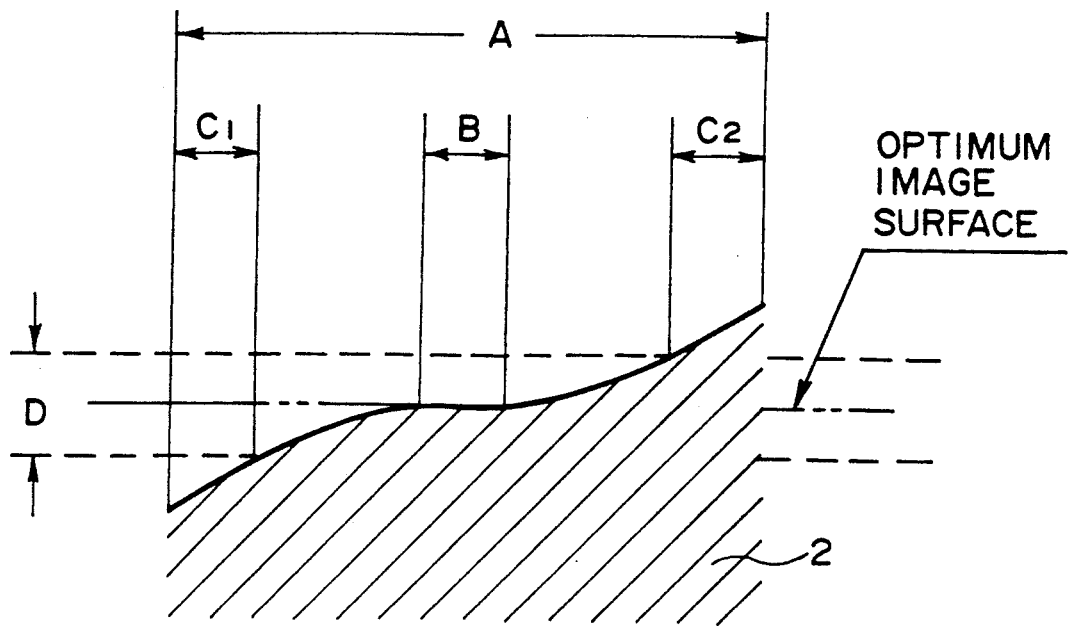
FIGS. 5A and 5B are representations, for explaining the advantageous effect of the detecting device of the first embodiment.

Referring to FIG. 5A, when the size of a zone to which a reticle pattern is about to be transferred is denoted by A, and if the wafer 2 surface is illuminated by a light beam having a diameter smaller than the size A, only an average inclination of a portion, such as that at B, of the zone A will be detected. Thus, adjustment would be made to the inclination of the stage, carrying the wafer 2 thereon, so as to bring the wafer surface inclination at the portion B into coincidence with the reticle pattern imaging optimum image surface (image surface of the projection lens 1) as depicted by a chain line.

If, in this state, the reticle pattern image printing is made to such a wafer 2 as having a resist coating and having a non-uniform surface configuration, wherein the depth of focus of the projection lens 1 within which satisfactory reticle pattern imaging is ensured, in practice is denoted by D, portions C1 and C2 of the zone A (to which a reticle pattern is to be transferred) are not placed within the depth of focus. This results in unsatisfactory reticle pattern transfer to the entire zone to be exposed.

Figure 5B:
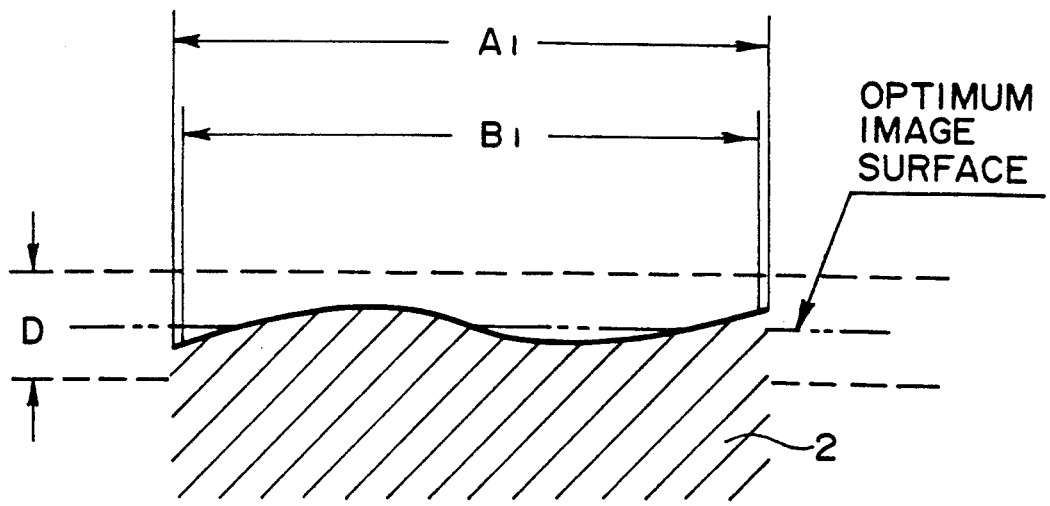

With the inclination detecting device of the present embodiment, as compared therewith, as best seen in FIG. 5B, such an illumination region B1 substantially corresponding to a zone A1 to be exposed to a reticle pattern, is defined, in which illumination region, the wafer is irradiated with light for the inclination detection.

This allows that, even for such a resist-coated wafer 2 as having a non-uniform surface configuration, an average inclination of the wafer 2 surface within the region B1 substantially corresponding to the zone A1 to be exposed to the reticle pattern is detected. As a result, precise adjustment can be made to bring the wafer 2 surface into coincidence with the optimum image surface of the reticle pattern imaging. This makes it possible to place the entire zone A1, to which the reticle pattern is to be transferred, within the depth of focus (D) of the projection lens 1, within which, satisfactory reticle pattern imaging is ensured, in practice. Consequence, even for such a resist-coated wafer 2 as that having a non-uniform surface configuration, superior reticle pattern transfer is assured over the entirety of the zone A1.

Particularly, the present embodiment uses a stop 6 whose aperture shape is variable. Thus, even if the size of the zone to be exposed (shot area) of a wafer is changed, adjustment of the size of the aperture of the stop 6 can easily make the illumination region in accord with the zone to be exposed. Therefore, independently of the size of a zone to be exposed, the above-described advantageous effects are obtainable.

In this embodiment, the stop 6 of variable aperture may be inclined with respect to the optical axis of the illuminating lens 8 (the optical axis of the light projecting system 101) so that the imaging relationship between the edge of the aperture of the stop 6 and a reference plane (in which the state of imaging of the reticle pattern is best) satisfies what can be called "Scheimpflug's condition". In that case, better results are obtainable.

Figure 6A:
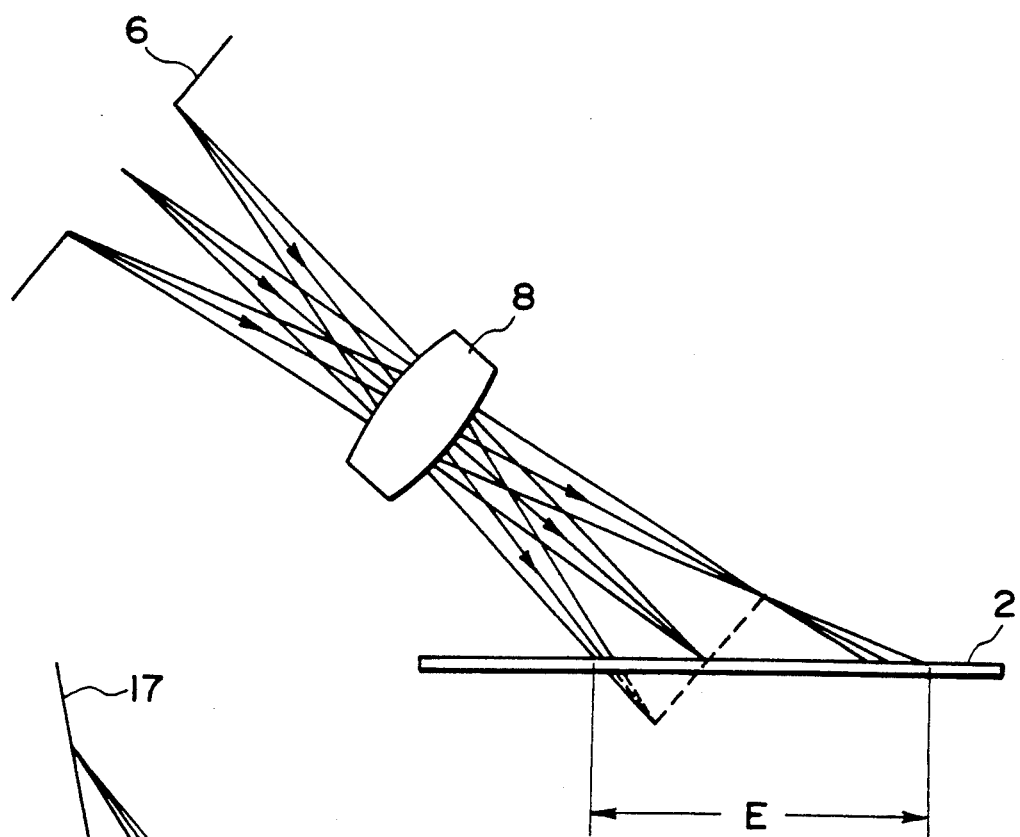
FIGS. 6A and 6B are schematic views, respectively, showing modified forms of the first embodiment.
Figure 6B:
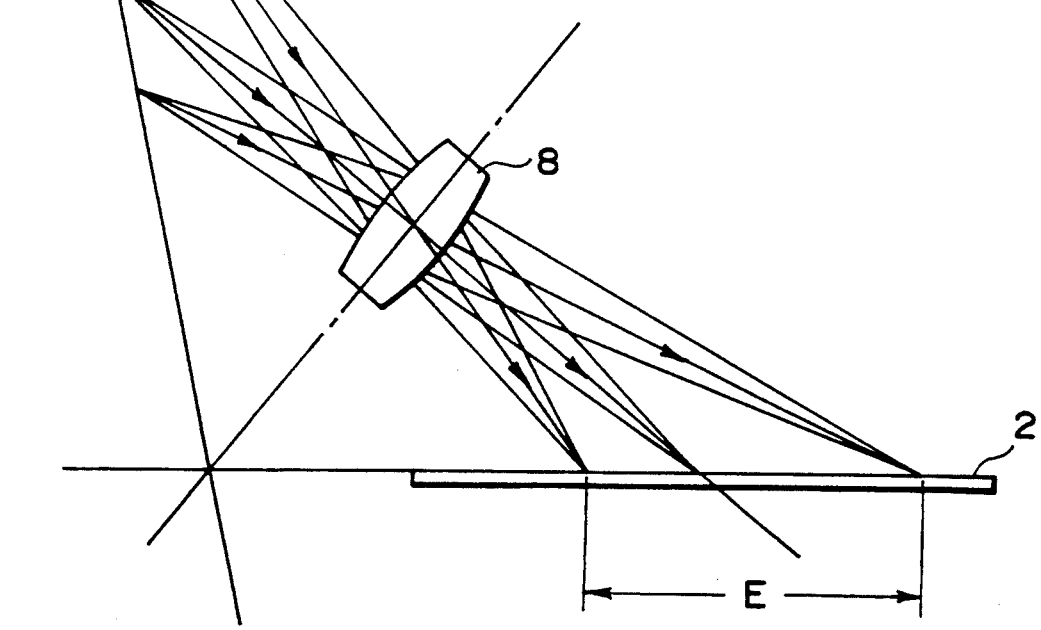

FIGS. 6A and 6B are representations for explaining the advantages obtainable when the disposition of the stop 6, the illuminating lens 8 and the wafer 2 is changed.

In the embodiment shown in FIG. 1, the aperture of the stop 6 and the reference plane in which the state of imaging of the reticle pattern is best do not satisfy an accurate imaging relationship, because, as shown in FIG. 6A, the edge of the aperture of the stop 6 is imaged on a plane which is perpendicular to the optical axis of the illuminating lens 8, as depicted by a broken line in this Figure.

More specifically, although the light advancing from the center of the aperture of the stop 6 is focused on the surface of the wafer 2 (in FIG. 6A, the wafer 2 surface coincides with the reference plane in which the state of imaging of the reticle pattern is best), those light beams coming from the peripheral portion of the aperture of the stop 6 are defocused on the surface of the wafer 2.

Figure 7A:
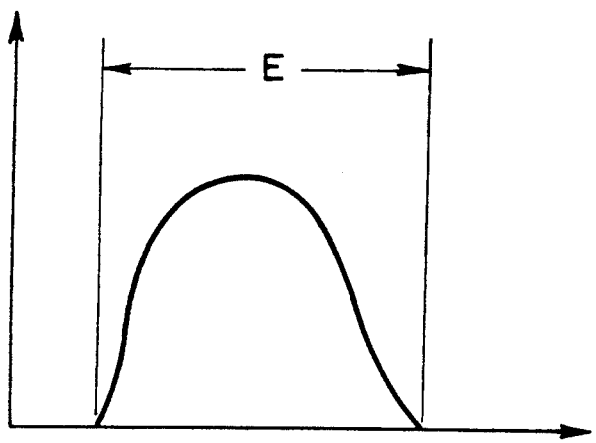
FIGS. 7A–7C are representations, for explaining the advantageous effects resulting from the structure shown in FIG. 6B.

On this occasion, even if the amplitude of the light at the aperture of the stop 6 is uniform in intensity, the amplitude intensity distribution of the light in the illumination region E of the wafer 2 surface, on which the image of the aperture of the stop 6 is projected, is such as that illustrated in FIG. 7A, for example, wherein there is a tendency that the intensity is low (due to defocusing) at a portion on which an edge portion of the aperture is projected, while the intensity is high at a central part in which correct focusing is attained. If the intensity of the light is not uniform in the illumination region E, the inclination detection will become unbalanced, based on the inclination information related to such a portion of the wafer surface as being illuminated by the high-intensity portion of the light.

For this reason, when it is desired to bring the inclination of the wafer surface having an uneven surface configuration into coincidence with the inclination of the reference plane, there is a possibility that, at a peripheral portion of the zone to which a reticle pattern is to be transferred, the wafer surface comes out of the depth of focus (D) of the projection lens system 1, as illustrated in FIG. 5A.

Figure 7B:
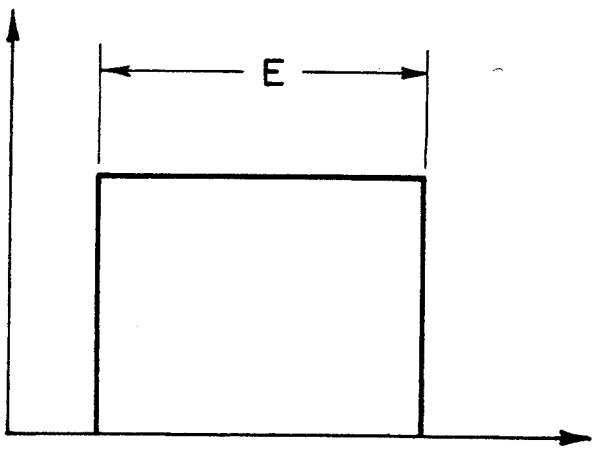

In consideration of this, as illustrated in FIG. 6B, a stop 17 having a variable aperture is so disposed that three planes (namely, a plane which is perpendicular to the optical axis of the illuminating lens 8 and which passes the center of the illuminating lens 8; a plane containing the edge of the aperture of the stop 17; and the reference plane in which the state of imaging of the reticle pattern is best) all intersect along one straight line, to thereby satisfy the "Scheimpflug's condition". With this arrangement, as illustrated in FIG. 6B, the aperture of the stop 17 can be imaged on the wafer 2 surface without any defocus. If, on that occasion, the intensity distribution in the aperture of the stp 17 is substantially uniform, then the intensity distribution of the light in the illumination region E on the wafer 2 surface can be made substantially uniform, such as illustrated in FIG. 7B.

Figure 7C:
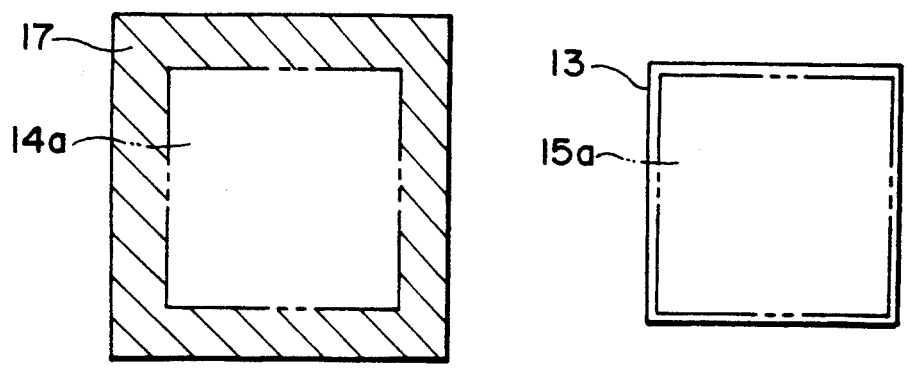

Further, on that occasion, as illustrated in FIG. 7C, an aperture 14a of a stop 17 and a region 15a (illumination region) in which the light is projected may have geometrically analogous shapes or, alternatively, they may have non-analogous shapes, such that the region 15a in which the light is projected corresponds to a zone 13 to which a reticle pattern is to be transferred.

By providing substantial correspondence between the illumination region and the zone to be exposed, and by providing a substantially uniform intensity distribution in the illumination region, it becomes possible to detect the wafer surface inclination information, with even weighting over the entirety of the zone to which the reticle pattern is to be transferred. As a result, any inclination of a wafer surface having an uneven surface configuration can be detected very precisely and, consequently, the peripheral portion of the zone to which the reticle pattern is to be transferred can be brought into coincidence with the reference plane (image surface of the projection lens system 1) with good precision, substantially the same as that concerning the central part of the zone.

Figure 11:
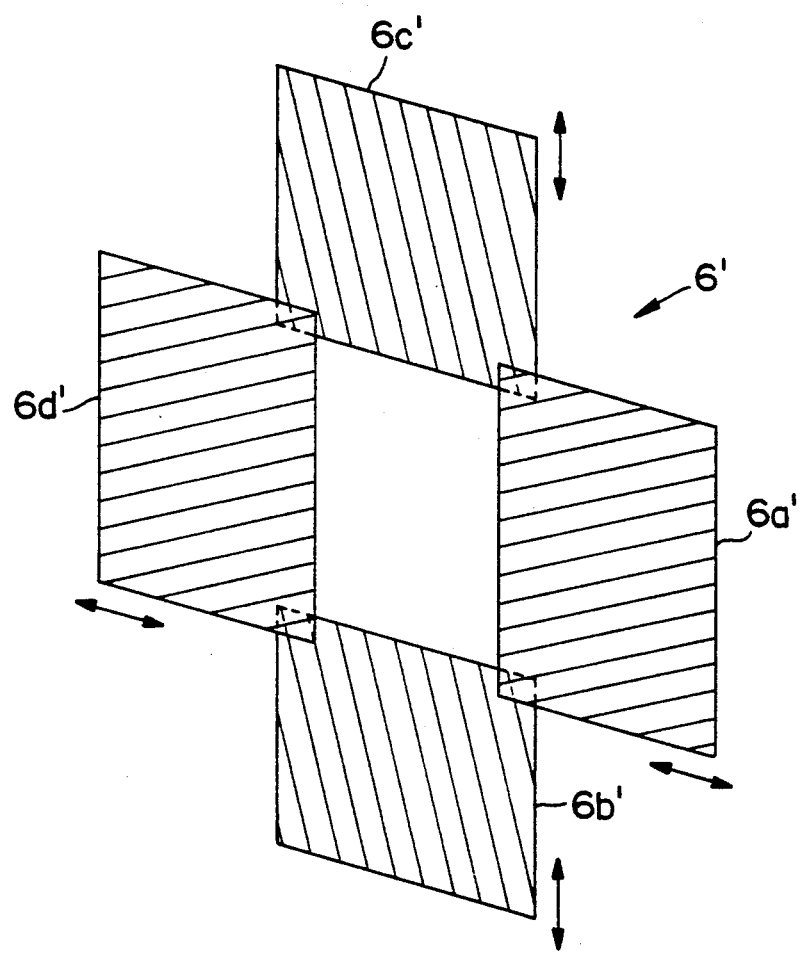
FIG. 11 depicts a mechanical stop means having four movable blades.

While, in this embodiment, liquid crystal shutter means is used as the stop 6 having a variable aperture, as an example, a mechanical stop means such as one having four movable blades which are combined to define a variable aperture, may be used. FIG. 11 depicts such a mechanical stop means 6' having four movable blades 6a', 6b', 6c' and 6d' which are respectively movable in the directions indicated by the double-head arrows and are combined to define a variable aperture. Stop means 6' may be used in lieu of the stop 6 in the position shown in FIG. 1. It is to be noted here that the concept of changing the beam diameter or the shape in accordance with the condition of the subject to be examined, by using such a variable stop means, is applicable not only to the surface inclination detection as in the foregoing embodiment, but also to the detection of the surface position itself of the subject to be examined.

Figure 12:
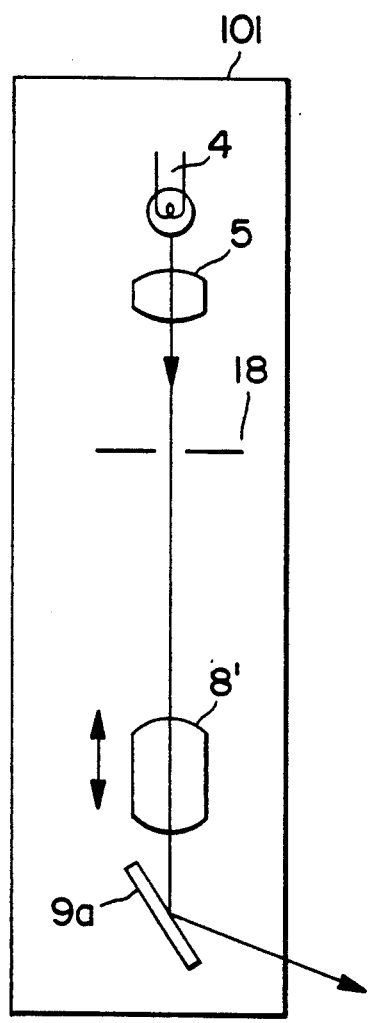
FIG. 12 depicts a light projecting system including a movable lens element used in conjunction with a fixed stop.

Further, instead of changing the shape of the aperture, a lens element in the light projecting system may be made movable along the optical axis and, by changing the position of such a lens, the size of the illumination region on the wafer surface may be changed. FIG. 12 depicts such a movable lens element 8' for use in the light projecting system 101 shown in FIG. 1. Like reference numerals in FIG. 12 represent like elements of FIG. 1 and further discussion thereof is omitted. Movable lens element 8' may be used in conjunction with a fixed stop 18 of the type discussed below with respect to FIG. 8. Movable lens element 8' is movable in the direction indicated by the double-head arrow along the optical axis of the light projecting system 101 for changing the size of the illumination region on the wafer surface (not shown).

The structure of the light projecting system and the light receiving system may be modified. As an example, since, in such an inclination detecting device as disclosed in the aforementioned U.S. Pat. No. 4,558,949, the wafer surface is illuminated by a parallel light so that a parallel reflected light is formed, the arrangement may be modified so that the refracting power of an optical system for forming a parallel light is changed, to change the diameter of the light beam. Alternatively, a stop such as illustrated in FIG. 1 may be inserted into the path of the parallel light.

Figure 8:
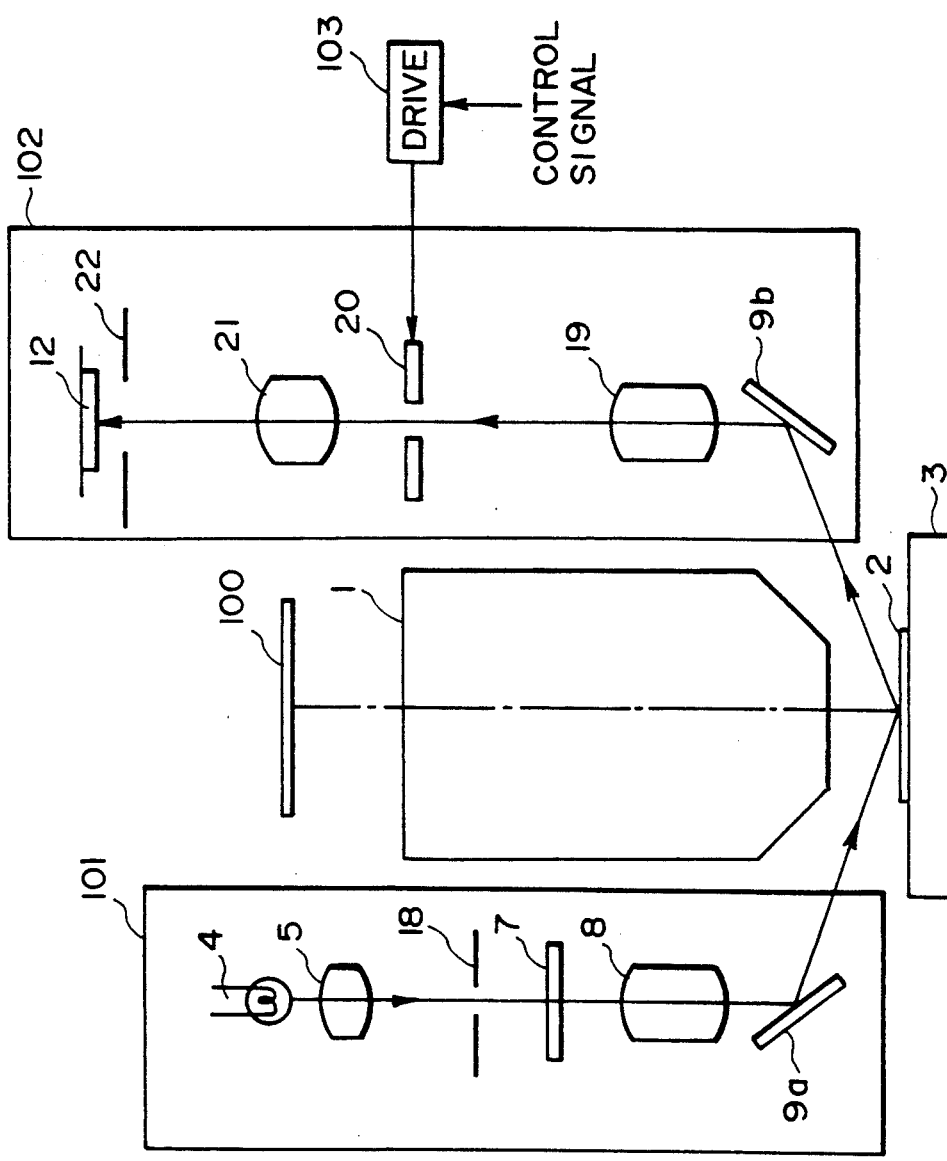
FIG. 8 is a schematic view of an inclination detecting device according to a second embodiment of the present invention.

FIG. 8 is a schematic view of an inclination detecting device according to a second embodiment of the present invention.

Denoted in FIG. 8 by reference numeral 18 is a stop having an aperture of a fixed diameter; and by reference numeral 20 is another stop having an aperture of variable diameter.

As compared with the first embodiment of FIG. 1 in which the variable stop 6 is included in the light projecting system 101, in the present embodiment, the light receiving system is provided with a variable stop 20. The stop 20 has the same structure as that of the stop 6.

Further, in the light receiving system 102, a detecting lens 21 is provided between the stop 20 and a photoelectric converting element 23 which is disposed after the stop 20. The photoelectric converting element 12 has a two-dimensional position detecting function and is disposed adjacent to a pupil plane of the detecting lens 21.

Denoted by reference numeral 22 is a stop which has a similar function as that of the stop 11 of the first embodiment and is disposed at a position spaced from a rear principal point of the detecting lens 21 by a focal length of the detecting lens 21.

The diameter of the fixed aperture of the stop 18 is set so that such a zone of the wafer 2 surface, which is larger than the maximum view angle of the projection lens 1, which is the limit to the reticle pattern transfer, can be illuminated with uniform illuminance.

In this embodiment, a relatively wide zone of the wafer 2 surface is illuminated by the light projecting system 101 and, by using an imaging lens 19, the zone of the wafer 2 being illuminated is imaged on the stop 20 of the variable aperture. Light passing through the aperture of the stop is directed, by the detecting lens 21, to the photoelectric converting element 12 which is disposed at the pupil plane of the detecting lens 21, whereby any inclination of the wafer 2 is detected.

In this embodiment, like the first embodiment, high-precision inclination detection is attainable, even to such a resist-coated wafer as having an uneven surface configuration. Of course, the inclination can be stably detected, independently of the size of the zone of the wafer to be exposed (the subject of examination).

Figure 9:
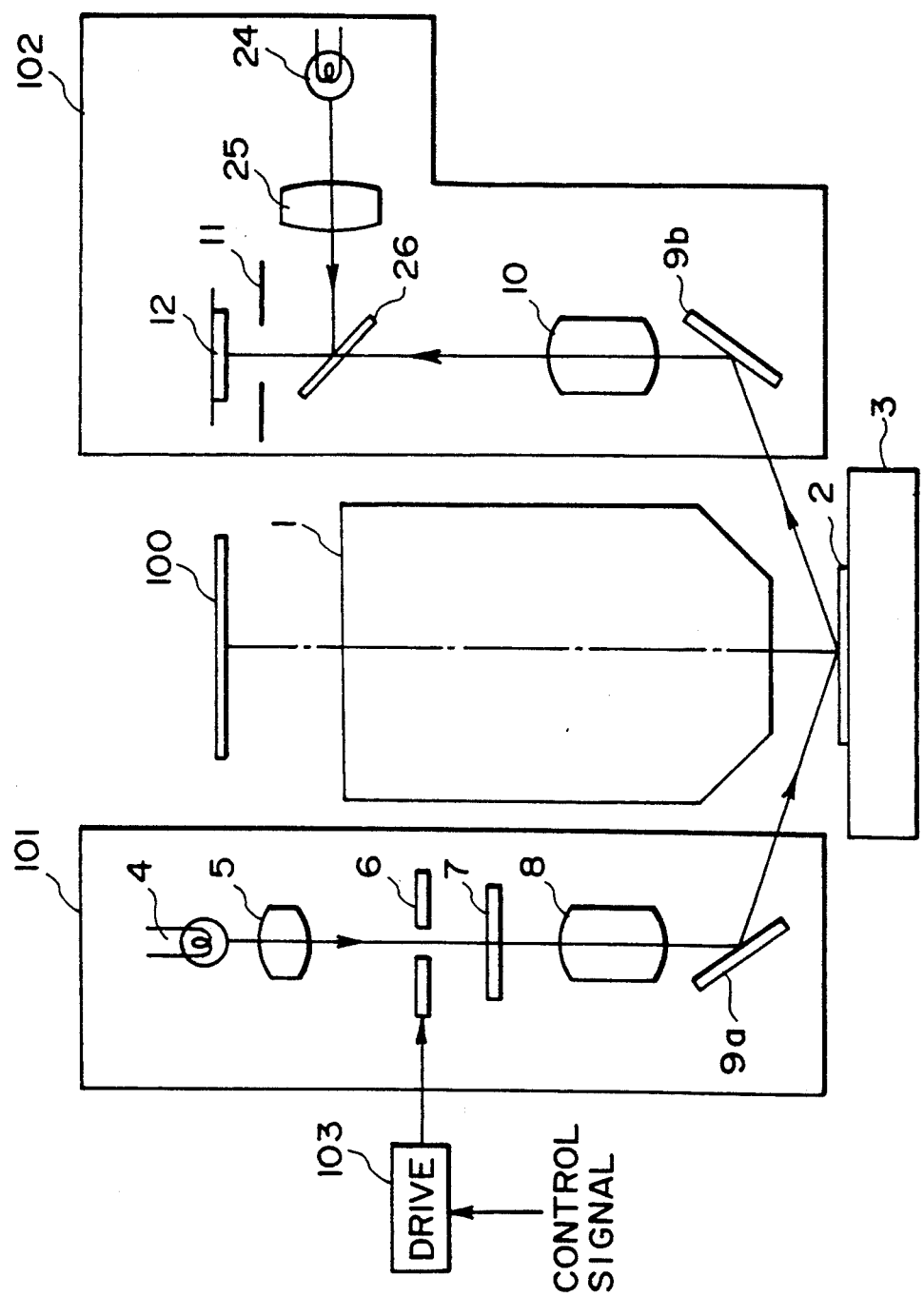
FIG. 9 is a schematic view of an inclination detecting device according to a third embodiment of the present invention.

FIG. 9 is a schematic view of an inclination detecting device according to a third embodiment of the present invention.

When, in the first and second embodiments, a two-dimensional position sensing diode (PSD) or a quadrant or quartered sensor diode is used to detect any inclination of a wafer on the basis of a positional deviation of the light incident on its light receiving surface, from a reference position, there is a possibility that, due to any change with time in the reference point (zero point) of the two-dimensional PSD, any change with time in the sensitivity of each of the quartered sensor portions of the quadrant sensor diode, or because of any other factor, there occurs a drift of the zero point corresponding to the reference position. In this embodiment, in consideration thereof, a reference light source 24, for supplying a reference light, is provided. More specifically, as shown in FIG. 9, a half mirror 26, inclined with respect to the photoelectric converting element 12, is inserted in the path for the inclination detecting light, and the reference light from the light source 24 is directed by way of a lens 25 and the half mirror 26 to the photoelectric converting element 12. Here, the light from the light source 24 is projected on the photoelectric converting element 12 in such a state wherein it has substantially the same expansion and substantially the same illuminance as that of the light from the light source 4 when it is incident on the photoelectric converting element 12.

When the light beams from the light sources 4 and 24 are projected on the photoelectric converting element 12 in a time-sharing fashion, signal outputs $\theta$ and $\theta_0$ are produced in sequence by the element 12. The relationship between the signal output ($\theta$ or $\theta_0$) and an error $\Delta$ in the zero point due to any change with time on an occasion when a two-dimensional PSD or a quadrant sensor is used as the photoelectric converting element 12, can be represented as follows:

$$\theta = \theta' + \Delta \text{ and}$$

$$\theta_0 = \theta_0' + \Delta$$

In order to avoid the effect due to such a change with time, in this embodiment, the signal output to be used for the detection of the inclination of the wafer surface is provided in accordance with the following equation:

$$\theta - \theta_0 = (\theta' + \Delta) + (\theta_0' + \Delta) = \theta' - \theta_0'$$

By this, the drift error $\Delta$ of the zero point of the photoelectric converting element 12 due to the change with time can be excluded, and the inclination of the wafer 2 can be detected with high precision.

Generally, in the manufacture of semiconductor devices, the zone of the projection lens, through which the reticle pattern transfer is to be executed, is divided into a plurality of parts, such that, through this one zone, a plurality of circuit patterns for a plurality of semiconductor chips are transferred. For example, such a reticle as shown in FIG. 10A is used, wherein, in one zone 13, through which the reticle pattern transfer is to be made, two circuit patterns for two semiconductor chips are formed in two regions 27a and 27b each being depicted by a chain line, are formed.

FIG. 10B is a fragmentary view showing a result of successive exposures for transferring reticle patterns to a wafer 2 surface, made in a reduction projection type exposure apparatus called a "stepper". Each zone 29, as encircled by a solid line, depicts the field in which reticle pattern transfer is made by one exposure (printing).

For efficient utilization of a wafer 2, even if a part of the zone for reticle pattern projection is out of the wafer 2, the projection printing is executed to such a region (shot area), like the region 30, depicted by a broken line, provided that such a region (shot area) includes a sufficient portion to which one of the circuit patterns 27a and 27b can be printed.

When the inclination detection is to be made to such a region (shot area) as denoted by reference numeral 30 in FIG. 10B, there is a possibility that a part of the light for the inclination detection goes out of the wafer 2 and thus, the portion of the light not impinging on the wafer is reflected by a reflective surface which is out of the shot area, and is not related thereto. If this occurs, the surface inclination cannot be detected, resulting in failure of the adjustment of the wafer surface inclination at the region to which the reticle pattern transfer is to be made, so as to be coordinate with the optimum image surface for the reticle pattern imaging.

In the present embodiment, in consideration thereof, for such a region as denoted by reference numeral 30 in FIG. 10B, wherein a part of the region is not present on the wafer 2, such a region can be predetermined at the stage of determination of a particular shot layout to a wafer (this being made in a console to be used for the control of the projection exposure apparatus) and the shape of the aperture of the stop, having the variable aperture, is changed so that, as shown in FIG. 10C, the inclination detecting light is projected substantially only to a half region 31 to which one of the two circuit patterns 27a and 27b for two semiconductor chips is to be transferred. By this, only with regard to such a half region 31 of one shot area of the wafer to which the reticle pattern transfer can be effectively made, any surface inclination within that half region can be detected correctly and, as a result, the surface can be adjusted so as to be coincident with the optimum imaging surface of the reticle pattern by the projection exposure apparatus.

In accordance with this embodiment of the present invention, as described, even if a portion of the region in which a reticle pattern is projected is not present on a wafer, the remaining portion can be accurately positioned with respect to an image surface of a projection lens, with a result of superior pattern transfer to such a remaining portion of the region. Therefore, the productivity of the semiconductor chips per one wafer can be improved.

In accordance with the present invention, as has hitherto been described, in the manufacture of semiconductor devices, for example, superior reticle pattern transfer is assured over the entire zone to which the reticle pattern transfer is to be made. Thus, the possibility of defects, or otherwise, of the circuit of a semiconductor chip due to unsatisfactory reticle pattern transfer, can be reduced, and manufacture of high-quality semiconductor chips, as well as high-yield chip manufacture, are ensured. Moreover, the cost of the semiconductor chip can be reduced.

While, in the foregoing the description has been made with reference to an inclination detecting device used in a semiconductor microcircuit device manufacturing exposure apparatus, the present invention is not limited to the detection of the inclination of a wafer. The present invention is also applicable to different types of devices, other than an exposure apparatus.

While the invention has been described with reference to the structures disclosed herein, it is not confined to the details set forth, and this application is intended to cover such modifications or changes as may come within the purposes of the improvements or the scope of the following claims.

what is claimed is:

1. A device for optically detecting deviation of a surface to be examined from a reference plane, said device comprising:

a detecting system comprising an irradiating optical system for projecting a light beam to the surface to be examined, and a light receiving optical system for receiving the light beam reflected by the surface;

photoelectric converting means for receiving the light beam from said light receiving optical system and for converting the received light beam into a signal corresponding to deviation of the surface from the reference plane; and stop means, disposed on a path of the light beam at a position optically conjugate with the surface to be examined, comprising a liquid crystal shutter having an array of portions each being operable as a shutter and each being independently driven of the others, wherein the array of portions of said liquid crystal shutter device are capable of being selectively opened in accordance with at least one of the shape and the size of the surface to be examined, to define an opening.

2. A device according to claim 1, wherein said irradiating optical system comprises a field stop having an opening of a predetermined shape, means for illuminating said field stop and an imaging optical system for projecting an image of the opening of said field stop onto the surface to be examined and for directing the light beam from the opening to the surface to be examined.

3. A device according to claim 1, wherein said stop means is disposed at a position within said light receiving optical system, which position is optically conjugate with the surface to be examined.

4. A device according to claim 1, wherein said stop means is disposed at a position within said irradiating optical system, which position is optically conjugate with the surface to be examined.

5. A device for optically detecting deviation of a surface to be examined from a reference plane, said device comprising:

a detecting system comprising an irradiating optical system for projecting a light beam to the surface to be examined, and a light receiving optical system for receiving the light beam reflected by the surface;

photoelectric converting means for receiving the light beam from said light receiving optical system and for converting the received light beam into a signal corresponding to deviation of the surface from the reference plane; and stop means, disposed on a path of the light beam at a position optically conjugate with the surface to be examined, comprising a plurality of movable blades, wherein said movable blades are selectively movable in accordance with at least one of the shape and the size of the surface to be examined, to define an opening.

6. A device according to claim 5, wherein said irradiating optical system comprises a field stop having an opening of a predetermined shape, means for illuminating said field stop and an imaging optical system for projecting an image of the opening of said field stop onto the surface to be examined and for directing the light beam from the opening to the surface to be examined.

7. A device according to claim 5, wherein said stop means is disposed at a position within said light receiving optical system, which position is optically conjugate with the surface to be examined.

8. A device according to claim 5, wherein said stop means is disposed at a position within said irradiating optical system, which position is optically conjugate with the surface to be examined.

9. A device for optically detecting deviation of a surface to be examined from a reference plane, said device comprising:

an irradiating optical system for projecting a light beam to the surface to be examined, and comprising a lens system movable along an optical axis of said irradiating optical system in accordance with at least one of the shape and the size of the surface to be examined to change at least one of the shape and the size of the light beam projected to the surface;

a light receiving optical system for receiving the light beam reflected by the surface; and photoelectric converting means for receiving the light beam from said light receiving optical system and for converting the received light beam into a signal corresponding to deviation of the surface from the reference plane.

10. A projection exposure apparatus comprising:

a movable stage for supporting a wafer;

a projection optical system for projecting an image of a circuit pattern onto a zone of the wafer supported by said movable stage;

an irradiating optical system for projecting a light beam to the zone of the wafer, and comprising a lens system movable along an optical axis of said irradiating optical system in accordance with at least one of the shape and the size of the zone of the wafer to change at least one of the shape and the size of the light beam projected to the zone;

a light receiving optical system for receiving the light beam reflected by the zone of the wafer; and photoelectric converting means for receiving the light beam from said light receiving optical system and for converting the received light beam into a signal corresponding to deviation of the zone of the wafer from an image plane of said projection optical system.

11. A projection exposure apparatus comprising:

a movable stage for supporting a wafer;

a projection optical system for projecting an image of a circuit pattern onto a zone of the wafer supported by said movable stage;

a detecting system comprising an irradiating optical system for projecting alight beam to the zone of the wafer and a light receiving optical system for receiving the light beam reflected by the zone of the wafer;

photoelectric converting means for receiving the light beam from said light receiving optical system and for converting the received light beam into a signal corresponding to deviation of the zone of the wafer from an image plane of said projection optical system; and stop means, disposed on a path of the light beam at a position optically conjugate with the zone of the wafer, comprising a plurality of movable blades, wherein said movable blades are selectively movable in accordance with at least one of the shape and the size of the zone, to define an opening.

12. A projection exposure apparatus comprising:
a movable stage for supporting a wafer;
a projection optical system for projecting an image of a circuit pattern onto a zone of the wafer supported by said movable stage;
a detecting system comprising an irradiating optical system for projecting a light beam to the zone of the wafer and alight receiving optical system for receiving the light beam reflected by the zone of the wafer;
photoelectric converting means for receiving the light beam from said light receiving optical system and for converting the received light beam into a signal corresponding to deviation of the zone of the wafer from an image plane of said projection optical system; and
stop means, disposed on a path of the light beam at a position optically conjugate with the zone of the wafer, comprising a liquid crystal shutter having an array of portions each being operable as a shutter and each being independently driven, wherein the array of portions of said liquid crystal shutter are capable of being selectively opened in accordance with at least one of the shape and the size of the zone, to define an opening.

13. A method of manufacturing semiconductor devices, wherein deviation of a zone of a wafer from a predetermined plane is detected by projecting a light beam onto the zone of the wafer and by detecting the light beam reflected by the zone of the wafer and, after correction of the detected deviation, a circuit pattern is printed on the zone of the wafer, said method comprising the steps of:
providing a stop on a path of the light beam at a position optically conjugate with the zone of the wafer, which stop includes a liquid crystal shutter having an array of portions, each being operable as a shutter and each being independently driven; and
selectively opening the array of portions of the liquid crystal shutter in accordance with at least one of the shape and the size of the zone of the wafer to define an opening of the stop,
wherein photoelectric conversion is limitedly effected on the zone by said opening step.

14. A method of manufacturing of semiconductor devices, wherein deviation of a zone of a wafer from a predetermined plane is detected by projecting a light beam onto the zone of the wafer and by detecting the light beam reflected by the zone of the wafer and, after correction of the detected deviation, a circuit pattern is printed on the zone of the wafer, said method comprising the steps of:
providing a stop on a path of the light beam at a position optically conjugate with the zone of the wafer, which stop includes a plurality of movable blades;
selectively moving the movable blades in accordance with at least one of the shape and the size of the zone of the wafer to define an opening of the stop,
wherein photoelectric conversion is limitedly affected on the zone by said moving step.

15. A method of manufacturing semiconductor devices, wherein deviation of a zone of a wafer from a predetermined plane is detected by projecting a light beam onto the zone of the wafer and by detecting the light beam reflected by the zone of the wafer and, after correction of the detected deviation, a circuit pattern is printed on the zone of the wafer, said method comprising the steps of:
providing a movable lens on a path of the light beam to the zone; and
moving the movable lens in accordance with at least one of the shape and the size of the zone of the wafer to change at least one of the shape and the size of the light beam upon the zone,
wherein photoelectric conversion is limitedly effected on the zone by said moving step.

* * * * *

UNITED STATES PATENT AND TRADEMARK OFFICE
CERTIFICATE OF CORRECTION

PATENT NO. : 5,218,415  
DATED : June 8, 1993  
INVENTOR(S) : Haruna Kawashima

Page 1 of 2

It is certified that error appears in the above-indentified patent and that said Letters Patent is hereby corrected as shown below:

COLUMN 3

Line 49, "FIG. 2A" should read --FIGS. 2A-- and "illustrates" should be deleted.

COLUMN 4

Line 5, "FIG. 2C" should read --FIG. 2C,--; and  
    Line 27, "part (C) of FIG. 2" should read --FIG. 2C.--.

COLUMN 5

Line 66, "tice" should read --tice,--.

COLUMN 6

Line 22, "quence," should read --quently,--.

COLUMN 7

Line 29, "stp 17" should read --stop 17--.

COLUMN 11

Line 14, "what" should read --What--.

UNITED STATES PATENT AND TRADEMARK OFFICE
CERTIFICATE OF CORRECTION

PATENT NO. : 5,218,415
DATED : June 8, 1993
INVENTOR(S) : Haruna Kawashima

It is certified that error appears in the above-indentified patent and that said Letters Patent is hereby corrected as shown below:

COLUMN 12

Line 67, "alight" should read --a light--.

COLUMN 13

Line 23, "alight" should read --a light--.

COLUMN 14

Line 14, "of" (second occurrence) should be deleted.

Signed and Sealed this

Fifth Day of July, 1994

Attest:

BRUCE LEHMAN

Attesting Officer    Commissioner of Patents and Trademarks